(12) United States Patent
Stanley et al.

(10) Patent No.: US 6,491,451 B1
(45) Date of Patent: Dec. 10, 2002

(54) WAFER PROCESSING EQUIPMENT AND METHOD FOR PROCESSING WAFERS

(75) Inventors: Timothy Stanley, Austin, TX (US); John Maltabes, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 104 days.

(21) Appl. No.: 09/706,201

(22) Filed: Nov. 3, 2000

(51) Int. Cl.⁷ .................. G03D 5/00; G05B 15/02; H01L 21/027
(52) U.S. Cl. .................. 396/611; 118/52; 414/935; 700/218
(58) Field of Search .................. 396/611; 414/935, 414/936, 937, 938, 939, 940, 941; 118/52; 700/214, 218

(56) References Cited

U.S. PATENT DOCUMENTS

| 6,099,598 | A | * | 8/2000 | Yokoyama et al. | 414/937 |
| 6,336,204 | B1 | * | 1/2001 | Jevtic | 414/936 |
| 6,235,634 | B1 | * | 5/2001 | White et al. | 414/217 |
| 6,264,748 | B1 | * | 7/2001 | Kuriki et al. | 118/715 |
| 6,275,744 | B1 | * | 8/2001 | Yoshida | 414/935 |
| 6,338,582 | B1 | * | 1/2002 | Ueda | 396/611 |
| 6,354,781 | B1 | * | 3/2002 | Pan | 414/939 |

FOREIGN PATENT DOCUMENTS

| EP | 0 359 525 A2 | 3/1990 |
| EP | 0 775 952 A2 | 5/1997 |
| JP | H01/243538 | 3/1989 |
| JP | H05/108114 | 4/1993 |
| JP | H11/260883 | 9/1999 |
| JP | H13/028327 | 1/2001 |

* cited by examiner

Primary Examiner—Alan A. Mathews

(57) ABSTRACT

A wafer processing equipment comprises a track (10) for transporting wafers, a wafer launch station (20) for launching wafers into a section of said track (10), a first wafer processing tool (30) for performing a first process to wafers in said section of said track (10), a buffer (40) for storing wafers processed by said first wafer processing tool (30), a second wafer processing tool (50) for performing a second process to wafers processed by said first wafer processing tool (30), and control means (70) for controlling said wafer launch station (20) such that every wafer launched by said launch station (20) is processed by said second processing tool (50) within a predetermined time window.

17 Claims, 1 Drawing Sheet

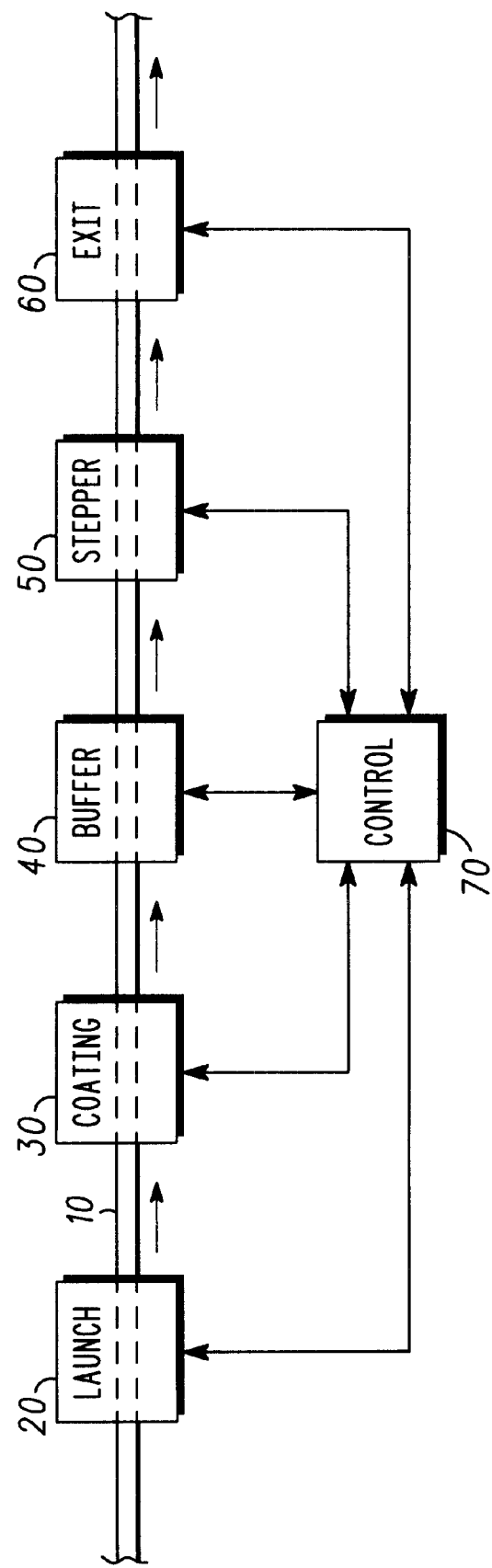

WAFER PROCESSING EQUIPMENT AND METHOD FOR PROCESSING WAFERS

FIELD OF THE INVENTION

The present invention generally relates to the field of semiconductor production, and more particularly to wafer processing equipment and a method for processing wafers.

BACKGROUND OF THE INVENTION

The processing of semiconductor wafers is well known.

This processing often begins by the patterning of a particular sequence of successive layers upon the wafer. Patterning of layers, often called photolithography, involves many steps. The first step might be to create a silicon dioxide insulating layer on the surface of the silicon wafer. Thereafter, removal of selective portions or sections of the insulating layer may be achieved to expose underlying silicon. Selective removal of silicon dioxide is achieved by spinning a photoresist material across the silicon dioxide surface. A mask is used to allow a source of ionizing or non-ionizing radiation to impinge at selective locations across the wafer. Depending upon whether the photoresist is positive-type or negative-type photoresist, certain areas of photoresist may dissolve when exposed to solvents, thereby exposing selective areas of silicon dioxide. Thereafter, the exposed portions of silicon dioxide can be removed by etching techniques commonly known in the art.

In many cases the timing between different process steps is critical. One example for such a critical timing between process steps is the time between the coating of a wafer and the exposure, especially if the DUV lithography is used. Another example for a critical timing between different process steps is the time between the exposure of a wafer and a following post exposure heating process. To achieve a proper timing is especially difficult since different processing tools in many cases comprised different throughputs. For example a coating device may be capable of processing about 42 wafers per hour, whereas a stepper device performing the exposure may be capable of processing 8 to 33 wafers per hour. In such cases a track to which the coating device and the stepper is assigned is usually configured to ensure that the stepper never waits. To ensure that the stepper never waits a track may comprise a buffer for intermediate storage of wafers to be processed by the stepper and the exposure device, respectively. However, if wafers are stored in such a buffer for a longer period the above mentioned timing problem becomes relevant.

BRIEF DESCRIPTION OF THE DRAWING

The FIGURE is a schematic block diagram showing a wafer processing device in accordance with an embodiment of the present invention.

DETAILED DESCRIPTION OF PREFERRED EMBODIMENTS

In accordance with the present invention a wafer processing device is provided, comprising:

a track 10 for transporting wafers, a wafer launch station 20 for launching wafers into a section of said track 10, a first wafer processing tool 30 for performing a first process to wafers in said section of said track 10, a buffer 40 for storing wafers processed by said first wafer processing tool 30, a second wafer processing tool 50 for performing a second process to wafers processed by said first wafer processing tool 30, and control means 70 for controlling said wafer launch station 20 such that every wafer launched by said launch station 20 is processed by said second processing tool 50 within a predetermined time window.

In accordance with the present invention there is further provided a method for processing wafers, said method comprising the following steps:

a) launching wafers into a section of said track 10 by said wafer launch station 20,
b) performing said first process to said launched wafers by said first processing tool 30,
c) providing said buffer 40 capable of storing wafers processed by said first wafer processing unit 30,
d) performing a second process to wafers processed by said first processing tool 30, and
e) controlling said wafer launch station 20 such that every wafer launched by said launch station 20 is processed by said second processing tool 50 within a predetermined time window.

For example if the first process to be performed to the wafer is a coating process and the second process to be performed to the wafer is an exposure process, the critical timing demands may be met by controlling said wafer launch station 20 such that every wafer launched by said launch station 20 is processed by said exposure device within a predetermined time window.

The critical timing demands may for example also be met if the first processing tool is an exposure device and the second processing tool is a heating device.

The controlling of the wafer launch station may for example be implemented via internal tool control software or in cell control software via the GEM/SECS interface or equivalent interfaces.

To meet the critical timing demands it is advantageous in many cases if said time windows starts when said first process is completed, i.e. when the coating is completed or when the exposure is completed.

The wafer processing equipment in accordance with the present invention may further comprise a wafer exit point 60 where wafers processed by said second processing tool 50, for example an exposure device or a heating device, leave the section of the track 10. An example for a simple control algorithm might be to launch a further wafer only when an earlier wafer leaves the respective section of the track 10, at least when a predetermined number of wafers is stored in the buffer 40.

Another possible control algorithm is to determine a maximum buffer load for said buffer 40 and to launch a further wafer only when an actual buffer load of said buffer 40 is smaller than said maximum buffer load.

To determine the maximum buffer load, for example one or more of the following points may be considered:

sources of variability of work arrival
operator responsiveness to alarm conditions
differences in processing rates between said first processing tool and said second processing tool
sensitivity of said second process to delays.

From the foregoing it may be seen that the present invention provides the introduction of rules that prevent for example the lithography equipment from accumulating too much WIP (wafers in process). The present invention further provides a control strategy that guarantees that no new wafer is launched unless it can be processed within an acceptable time window.

With the present invention a bottleneck for example with photo tools may be avoided, the cycle times, for example for photo steps, may be reduced, the variability of cycle times may be reduced, the manufacturing progress may become more transparent, and the line control may benefit.

The FIGURE is a schematic block diagram showing one embodiment of a wafer processing equipment in accordance with the present invention. A section of a track 10 comprises a launch station 20 for launching wafers into said section of the track 10. Usually the wafers are moved along the track 10 in suitable pods, for example in FOUPs (front opening unified pod). In the FIGURE a first processing tool is shown as a coating device 30 for coating the wafers with a suitable photoresist. This coating device 30 may for example have a throughput of about 42 wafers per hour. A second processing tool is shown as a stepper 50. This stepper 50 performs an exposure process to the wafers coated by said coating device 30. The stepper 50 may for example have a throughput of 8 to 33 wafers per hour. Since the throughput of the stepper 50 is lower than the throughput of the coating device 30, a buffer 40 is provided for intermediate storage of wafers already processed by said coating device 30. When the exposure process is completed by the stepper 50 the wafers leave the section of the track 10 at an exit point 60. In accordance with the FIGURE control means 70, which for example may be realized by computer hard- and software, are connected with the wafer launch station 20, the coating device 30, the buffer 40, the stepper 50, and the exit point 60.

In accordance with a first embodiment of the wafer processing device the control means 70 control the wafer launch station 20 such that, when the buffer 40 contains a predetermined number of wafers, a further wafer is launched only when an earlier wafer leaves said section of the track 10 at the exit point 60. With this embodiment the predetermined number of wafers may be the number of wafers that are stored in the buffer 40 if the buffer 40 is physically full.

In accordance with a second embodiment of the wafer processing equipment the control means 70 determine a maximum buffer load for said buffer 40 and control said wafer launch station 20 such that a further wafer is launched only when an actual buffer load of said buffer 40 is smaller than said maximum buffer load. With this embodiment the maximum buffer load may be smaller than the maximum number of wafers that may be stored in the buffer 40 due to its physical size. In other words, by electronically altering the buffer size to an optimal value, the optimal release rate may be achieved since wafers are not launched if this electronically altered buffer is full.

The first embodiment is well as the second embodiment may be implemented via internal tool control software or in cell control software via the GEM/SECS or equivalent interfaces.

While the invention has been described in terms of particular structures, devices and methods, those of skill in the art will understand based on the description herein that it is not limited merely to such examples and that the full scope of the invention is properly determined by the claims that follow.

What is claimed is:

1. A wafer processing equipment, comprising:
   a track for transporting wafers,
   a wafer launch station for launching wafers into a section of said track,
   a first wafer processing tool for performing a first process to wafers in said section of said track,
   a buffer for storing wafers processed by said first wafer processing tool,
   a second wafer processing tool for performing a second process to wafers processed by said first wafer processing tool, and
   control means for controlling said wafer launch station such that every wafer launched by said launch station is processed by said second processing tool within a predetermined time window and such that the launching of the wafers by said launch station is dependent upon an actual buffer load of said buffer.

2. The wafer processing equipment according to claim 1, wherein said first wafer processing tool is a coating device, and wherein said second wafer processing tool is a wafer exposure device.

3. The wafer processing equipment according to claim 1, wherein said first wafer processing tool is a wafer exposure device, and wherein said second wafer processing tool is a post exposure heating device.

4. The wafer processing equipment according to claim 1, wherein said time window starts when said first process is completed.

5. The wafer processing equipment according to claim 1, further comprising a wafer exit point where wafers processed by said second processing tool leave said section of said track, wherein said control means, at least when a predetermined number of wafers is stored in said buffer, control said wafer launch station such that a further wafer is launched only when an earlier wafer leaves said section of said track at said exit point.

6. The wafer processing equipment according to claim 1, wherein said control means determine a maximum buffer load for said buffer, and wherein said control means control said wafer launch station such that a further wafer is launched only when an actual buffer load of said buffer is smaller then said maximum buffer load.

7. The wafer processing equipment according to claim 1, wherein said control means determine a maximum buffer load for said buffer, wherein said control means control said wafer launch station such that a wafer is launched only when an actual buffer load of said buffer is smaller then said maximum buffer load, and wherein said maximum buffer load is determined considering one or more of the following points:
   sources of variability of work arrival
   operator responsiveness to alarm conditions
   differences in processing rates between said first processing tool and said second processing tool
   sensitivity of said second process to delays.

8. The wafer processing equipment according to claim 1, wherein said control means control said wafer launch station such that a further wafer is launched only when an actual buffer load of said buffer is smaller than a first buffer load level.

9. A method for processing wafers, said method comprising at least the following steps:
   a) launching wafers into a section of a track by a wafer launch station,
   b) performing a first process to said launched wafers by a first processing tool,
   c) providing a buffer capable of storing wafers processed by said first wafer processing unit,
   d) performing a second process to wafers processed by said first processing tool, and
   e) controlling said wafer launch station such that every wafer launched by said launch station is processed by said second processing tool within a predetermined time window and such that the launching of the wafers by said launch station is dependent upon an actual buffer load of said buffer.

10. The method according to claim 9, wherein said first process is a coating process, and wherein said second process is an exposure process.

11. The method according to claim 9, wherein said first process is an exposure process, and wherein said second process is heating process.

12. The method according to claim 9, wherein said time window starts when said first process is completed.

13. The method according to claim 9, wherein, at least if a predetermined number of wafers is stored in said buffer, said wafer launch station is controlled such that a further wafer is launched only when an earlier wafer leaves said section of said track.

14. The method according to claim 9, wherein said controlling of said wafer launch station comprises:

determining a maximum buffer load for said buffer, detecting an actual buffer load of said buffer, and launching a further wafer only when said actual buffer load of said buffer is smaller than said maximum buffer load.

15. The method according to claim 9, wherein said controlling of said wafer launch station comprises:

determining a maximum buffer load for said buffer, thereby considering one or more of the following points:

sources of variability of work arrival operator responsiveness to alarm conditions differences in processing rates between said first processing tool and said second processing tool sensitivity of said second process to delays, detecting an actual buffer load of said buffer, and launching a further wafer only when said actual buffer load of said buffer is smaller than said maximum buffer load.

16. The method according to claim 9, wherein, if the actual buffer load is equal to at least a predetermined number, said wafer launch station is controlled such that a further wafer is launched only when an earlier wafer leaves said section of said track.

17. The method according to claim 9, wherein said controlling of said wafer launch station comprises:

detecting an actual buffer load of said buffer, and launching a further wafer only when said actual buffer load of said buffer is smaller than a first buffer load level.

\* \* \* \* \*